United States Patent
Strutt et al.

(10) Patent No.: US 11,536,759 B2
(45) Date of Patent: Dec. 27, 2022

(54) ABSORPTION RATE DETECTION

(71) Applicant: Elliptic Laboratories AS, Oslo (NO)

(72) Inventors: Guenael Thomas Strutt, San Francisco, CA (US); Tom Øystein Kavli, Nittedal (NO); Espen Klovning, Strømmen (NO); Shangdong Gu, Oslo (NO)

(73) Assignee: Elliptic Laboratories AS, Oslo (NO)

( * ) Notice: Subject to any disclaimer, the term of this patent is extended or adjusted under 35 U.S.C. 154(b) by 0 days.

(21) Appl. No.: 17/261,836

(22) PCT Filed: Oct. 4, 2019

(86) PCT No.: PCT/NO2019/050211
§ 371 (c)(1),
(2) Date: Jan. 20, 2021

(87) PCT Pub. No.: WO2020/071927
PCT Pub. Date: Apr. 9, 2020

(65) Prior Publication Data
US 2021/0293868 A1    Sep. 23, 2021

Related U.S. Application Data

(60) Provisional application No. 62/741,219, filed on Oct. 4, 2018.

(30) Foreign Application Priority Data

Nov. 7, 2018    (NO) .................................. 20181429

(51) Int. Cl.
*G01R 29/08*    (2006.01)
*H04B 1/3827*    (2015.01)

(52) U.S. Cl.
CPC ....... *G01R 29/0857* (2013.01); *H04B 1/3838* (2013.01)

(58) Field of Classification Search
CPC ............ G01R 29/0857; G01R 29/0814; H04B 1/3838; G01S 2007/52007; G01S 7/52004;
(Continued)

(56) References Cited

U.S. PATENT DOCUMENTS 8,738,093 B1 *   5/2014  Gopalakrishnan ... H04B 1/3838
                                                                    455/100
8,775,103 B1 *   7/2014  Jayaraj ................. H03K 17/955
                                                                    702/57

(Continued)

FOREIGN PATENT DOCUMENTS

CN        108156655 A      6/2018

OTHER PUBLICATIONS

Svehagen, Gro; International Search Report; PCT/NO2019/050211; dated Dec. 19, 2019; 3 pages.

*Primary Examiner* — Jinsong Hu
*Assistant Examiner* — Rui M Hu
(74) *Attorney, Agent, or Firm* — Shackelford, Bowen, McKinley & Norton, LLP

(57) ABSTRACT

Present teachings relate to a method for proximity detection on an electronic device, the method comprising the steps of: performing a first measurement using a first sensor; calculating, using a processing unit, a first distance value from the first measurement; the first distance value being indicative of the distance between a user and the electronic device; in response to the first distance value, through the processing unit, adapting an energy level on the electronic device, said energy level being related to the Specific Absorption Rate ("SAR"), such that predefined SAR requirements due to (Continued)

exposure of emitted energy from the electronic device are met. The present teaching further relate to an electronic device comprising a measurement system configured to control an energy level on the electronic device, said energy level being related to the Specific Absorption Rate ("SAR"). The present teachings also relate to a computer software product for implementing any method steps disclosed herein.

20 Claims, 10 Drawing Sheets

(58) Field of Classification Search
CPC ....... G01S 15/04; G01S 15/08; H03K 17/955; H03K 2217/96007; H03K 2217/94026; H03K 2217/94073; H03K 2217/94078
See application file for complete search history.

(56) References Cited

U.S. PATENT DOCUMENTS

| | | | |
|---|---|---|---|
| 8,792,930 B1* | 7/2014 | Gopalakrishnan .. | H04W 52/228 455/117 |
| 8,886,247 B1* | 11/2014 | Price .................... | H04B 1/3838 455/575.4 |
| 8,989,792 B1* | 3/2015 | Depew ................ | H04B 1/3838 455/575.4 |
| 9,374,655 B1* | 6/2016 | Lee ........................ | H04W 4/80 |
| 9,867,139 B1* | 1/2018 | Khasgiwala ......... | H04B 17/318 |
| 9,929,763 B1* | 3/2018 | Zheng .................. | H04B 1/3838 |
| 10,340,968 B1* | 7/2019 | Bang .................... | H04B 1/3838 |
| 10,467,438 B1* | 11/2019 | Renner ............... | G06F 11/2284 |
| 2009/0305742 A1* | 12/2009 | Caballero ........... | H04W 52/283 455/566 |
| 2011/0250928 A1 | 10/2011 | Schlub et al. | |
| 2012/0052820 A1* | 3/2012 | Lin ...................... | H04B 1/3838 455/90.2 |
| 2012/0077538 A1* | 3/2012 | Yun ...................... | H04W 52/52 455/522 |
| 2014/0315592 A1* | 10/2014 | Schlub ................ | H04W 52/367 455/522 |
| 2014/0328488 A1* | 11/2014 | Caballero ............... | G01S 15/02 381/58 |
| 2015/0200444 A1 | 7/2015 | Mercer et al. | |
| 2015/0237183 A1 | 8/2015 | Novet | |
| 2015/0295613 A1* | 10/2015 | Kim ..................... | H04B 1/3838 455/550.1 |
| 2016/0050633 A1* | 2/2016 | Yun ..................... | H04W 52/228 455/574 |
| 2016/0302155 A1 | 10/2016 | Nilsson | |
| 2018/0062684 A1* | 3/2018 | Kim .................... | H04W 52/283 |
| 2018/0175944 A1* | 6/2018 | Seyed .................. | H04B 1/3838 |
| 2019/0260409 A1* | 8/2019 | Ban ....................... | G01R 22/10 |
| 2019/0297416 A1* | 9/2019 | Deng ..................... | H04S 7/303 |
| 2019/0341955 A1* | 11/2019 | Harper ................ | G01S 7/52004 |
| 2019/0346692 A1* | 11/2019 | Langford ............ | G01S 7/52079 |

* cited by examiner

ABSORPTION RATE DETECTION

TECHNICAL FIELD

Present teachings relate generally to a Specific Absorption Rate for an electronic device.

BACKGROUND ART

Specific Absorption Rate ("SAR") is a measure of energy absorbed by a human body that is exposed to a field or radiation. SAR may be defined as a rate at which energy, such as electromagnetic ("EM") field, is absorbed by the body. The term Specific Absorption Rate or SAR is well known in the field of art of electronic devices such as mobile phones, which emit radio frequency ("RF") signals.

In several countries or jurisdictions, acceptable SAR limits or levels have been defined by their respective governments. To be allowed to sell an electronic device in a given jurisdiction, the device must satisfy the SAR limits for that jurisdiction. For example, government agencies such as CENELEC and the FCC are responsible for specifying SAR limits for the EU and the USA, respectively. Often SAR limits in certain jurisdictions will follow certain standards, such as the IEC.

There is thus a requirement for measuring or at least estimating the SAR during the operation of the electronic device.

SUMMARY

At least some problems inherent to the prior-art will be shown solved by the features of the accompanying independent claims.

Viewed from a first perspective, there can be provided a method for estimating the Specific Absorption Rate ("SAR") of an electronic device based on the measurement of a distance between the electronic device and a user. It will be appreciated that the user in this context is the user that is closest to the electronic device.

According to an aspect, the electronic device may adapt its RF energy, e.g., transmitted RF signal, based upon the distance between the electronic device and the user. For example, as the distance between the user and the electronic device drops, the electronic device may change from a high-power mode to a low-power mode. By doing so, the data communication performance of the electronic device may be balanced with the SAR requirements. The changeover from the high-power mode to the low-power mode and vice versa may be based on discrete threshold distance values, or it may be based a more smooth variation of the RF energy dependent upon an instantaneous distance value. The instantaneous distance value is a measurement of the distance between the user and the electronic device at a given time.

In some cases, the distance measurement may be done by using an infrared ("IR") sensor, alternatively or in addition, by using dedicated capacitive sensors. IR proximity sensors can be found in a majority of mobile phones in the market. As it will be appreciated, the IR proximity sensors rely upon measurement of IR radiation reflected by a user. Capacitive sensors rely upon a change induced in a capacitance value due to the presence of a user in the proximity of the device. In some cases, the capacitive touchscreen sensor, found in most of the mobile phones, may be used for detecting the distance of the user. However, most touchscreens provide reliable measurements at only very small distance values, e.g., 10 mm or less between the user and the touchscreen. Even in the so known as a self-capacitance mode of the touchscreen, reliable measurements above a distance of 20 millimeters can be difficult to achieve in all operating conditions.

In mobile phones with minimal or essentially no bezel, it may further be a challenge to find an appropriate placement for the sensors such as IR and dedicated capacitive sensors.

Viewed from a second perspective, there can be provided a method for proximity detection on an electronic device, the method comprising the steps of:

performing a first measurement using a first sensor where the sensor is preferably an ultrasound sensor;

calculating, using a processing unit, a first distance value from the first measurement; the first distance value being indicative of the distance between a user and the electronic device;

in response to the first distance value, through the processing unit, adapting an energy level on the electronic device, said energy level being related to the Specific Absorption Rate ("SAR"), such that predefined SAR requirements due to exposure of emitted energy from the electronic device are met.

It will be appreciated that by saying "the distance between the user and the electronic device", the phrase also includes measuring the distance between an input object, such as a body part of the user, and the electronic device. The latter is especially relevant when the user is in close proximity to the electronic device, e.g., within a hundred millimeters from the device. In such cases, distance measurement from a body part (e.g., a finger) of the user or an object (e.g., a pen or a stylus) held by the user closest to the electronic device are often most relevant. In contrast, when the user is relatively far, the distance measurement may be relatively coarse and rely more upon the overall position of a side or surface of the user from the electronic device.

Predefined SAR requirements can be any one or more parameters that relate to the rate at which EM energy is absorbed by the human body. SAR parameters may be defined from standards.

It will be appreciated that by doing this, the electronic device may adapt a level of its emitted energy, e.g., transmitted RF signal, dependent upon, or in relationship to, the distance of the electronic device from the user. This may enable the electronic device to operate in a high-power mode when the user is far and change to a low-power mode when the user is near.

It is, however, an addition problem that the distance detection as such may detect a presence that is not a user and thus change into low powered mode without the presence of a user. Thus it is an addition object of the present invention distinguish between the objects reflecting the ultrasound signals. This may be obtained by analyzing, using said processing unit, the received ultrasound signal so as to calculate the characteristics of the reflecting material based on the shape and attenuation of the received ultrasound signal, such as evaluating the attenuation and dispersion of the received acoustic signals, being able to identify the softness of a material to some degree and thus be able to distinguish between soft materials such as skin and hard materials.

It will further be appreciated that the processing unit may be configured to adapt the energy level either by continuous measurements using the first sensor, or it may be intermittent measurements performed at regular or irregular time periods, or the measurement may be a single measurement triggered by another sensor operationally related to the electronic device. It will be understood that the processing unit may even adapt the energy level using a combination of the above, based on a use case of the electronic device. A use case may be a distinct usage scenario of the electronic device, such as, the electronic device lying on an essentially flat surface (e.g., table), the device being held in a hand, the device being in a pocket, etc. The processing unit may balance the need for further measurements based upon the activity on or around the electronic device. For example, if the electronic device is lying on a table with no user around, the electronic device may decide to perform relatively infrequent intermittent measurements. Upon detection of an object within a predetermined region around the electronic device, it may switch to more frequent intermittent measurements, or even continuous measurements if the object moves even closer to the device. The processing unit may adapt or adjust the energy level either based on a single measurement, or based on multiple measurements. In some cases, the processing unit may defer adjusting or changing the energy level until a subsequent measurement.

According to an aspect the first sensor is an acoustic sensor, involving the transmission and reception of acoustic signals. In several applications, it can be advantageous to use an ultrasonic acoustic sensor because it is inaudible to most humans. Accordingly, the first sensor can be an ultrasound sensor involving the transmission and reception of ultrasound signals. The ultrasound sensor may comprise an ultrasound transmitter and an ultrasound receiver. The ultrasound transmitter and the ultrasound receiver may be separate devices, such as a speaker and a microphone, or they may be the same device configured to operate as transmitter and receiver at different times. For example, an ultrasound transducer may be configured to operate as a transmitter for transmitting an ultrasound signal in a transmit mode, and the same transducer may be configured to operate as a receiver for receiving a reflection or echo of the ultrasound signal in a receive mode. As will be appreciated, the transmit and receive modes for the ultrasound transducer are configured non-simultaneously. Accordingly, a use of ultrasound sensor for measurements involves transmitting an ultrasound signal from an ultrasound transmitter, generating a measured signal by receiving at an ultrasound receiver an echo of the ultrasound signal being reflected by an object, and analyzing the echo by processing the measured signal.

In this disclosure, references to a transmitter or a receiver, especially in terms of an ultrasound sensor, cover all functioning alternatives of the sensor, i.e., the transmitter and the receiver being separate devices, both the same device, or any combination of any available transmitter functionally related to the electronic device and any available receiver functionally related to the electronic device should the electronic device comprise a plurality of ultrasonic sensors. In some cases, the ultrasound sensor may comprise a non-equal number of transmitters and receivers, for example, the ultrasound sensor may in certain cases comprise one transmitter and two receivers. The number of transmitters and/or receivers is non-limiting to the scope or generality of this disclosure.

According to an aspect, the first sensor being an ultrasound sensor, the method further comprises the steps of:
  performing the first measurement by: transmitting an ultrasound signal from an ultrasound transmitter, and by generating a measured signal by receiving, at an ultrasound receiver, an echo of the ultrasound signal being reflected by an object;
  calculating the first distance value by processing the measured signal.

According to an alternative aspect, the invention also includes another kind of sensor, such as a capacitive sensor. In such cases, the method comprises the steps of:
  performing a measurement by generating an electrical signal using another sensor, the electrical signal indicative of the distance between a user and the electronic device;
  calculating the first distance value by processing the electrical signal.

In some cases, the capacitive sensor is a dedicated capacitive sensor for proximity detection. Alternatively, or in combination to the dedicated capacitive sensor, the capacitive sensor may be a touchscreen sensor. In other words, a mode of the touchscreen sensor may be used for proximity detection especially for low distances (e.g., 30 mm or lower) between an input object, such as a body part of the user, and the electronic device.

As it will be understood, the electrical signal may be a voltage, a current, an impedance, such as capacitance, or a signal comprising any of their combination.

For improving measurement reliability, the above method may be extended further such that viewed from another perspective, there can also be provided a method for proximity detection, the method comprises the steps of:
  performing a first measurement using a first sensor;
  calculating, using a processing unit, a first distance value from the first measurement; the first distance value being indicative of the distance between a user and the electronic device;
  calculating, using the processing unit, a first quality factor related to the first measurement;
  dependent upon the first quality factor, deciding if the processing unit adapts an energy level on the electronic device in relationship to the first distance value; wherein said energy level is related to the Specific Absorption Rate ("SAR"), such that predefined SAR requirements due to exposure of emitted energy from the electronic device are met for the user.

It will be understood that the first quality factor here represents a reliability or confidence related to the first measurement. The quality factor can hence represent a probability limit or value indicating that the measurement can be trusted for performing any further operation in response to the measurement being true. Thus, according to an aspect, if the first quality factor meets a first criterion, the processing unit adapts the energy level in relationship to, or dependent upon, the first distance value. Accordingly, the method further comprises the step:
  If the first quality factor meets a first criterion, adapting the energy level through the processing unit.

As discussed previously, the first criterion may be a probability or confidence limit or value.

According to an alternative aspect, if the first quality factor does not meet the first criterion, the processing unit does not adapt the energy. Accordingly, the method further comprises the step:
  If the first quality factor does not meet the first criterion, unaffecting the energy level through the processing unit.

According to an aspect, the processing unit may decide to repeat the first measurement. Thus, further according to the alternative aspect, the method comprises the steps:
  performing an another first measurement using the first sensor;
  calculating, using the processing unit, an another first distance value from the another first measurement; the another first distance value being indicative of the distance between the user and the electronic device;

calculating, using the processing unit, an another first quality factor related to the another first measurement;

dependent upon the another first quality factor, deciding if the processing unit adapts the energy level on the electronic device.

Accordingly, if the measurement quality is acceptable the energy level may be adapted in relationship to the another first distance value. Hence, the method further comprises the step:

If the another first quality factor meets the first criterion, adapting the energy level through the processing unit.

Similar to the above discussions, according to an alternative aspect, if the another first quality factor does not meet the first criterion, the processing unit does not adapt the energy level. Accordingly, the method further comprises the step:

If the another first quality factor does not meet the first criterion, unaffecting the energy level through the processing unit.

Further according to the alternative aspect, the another first measurement may be used for improving an overall measurement reliability and thus calculate an overall quality factor related to a plurality or a series of measurements. Accordingly, the first quality factor may be combined or evaluated together with the another first quality factor to calculate the overall quality factor. The method may thus comprise:

processing, using the processing unit, the first measurement in relationship with the another first measurement;

calculating, using the processing unit, an overall quality factor related to the first measurement and the another first measurement;

dependent upon the overall quality factor, deciding if the processing unit adapts the energy level on the electronic device.

Accordingly, if the measurement quality is acceptable the energy level may be adapted in relationship to the another first distance value. Hence, as previously discussed the method further comprises the step:

If the overall quality factor meets an overall criterion, adapting the energy level through the processing unit.

Similar to the above discussions, according to an alternative aspect, if the another first quality factor does not meet the overall criterion, the processing unit does not adapt the energy level. Accordingly, the method further comprises the step:

If the overall quality factor does not meet the overall criterion, unaffecting the energy level through the processing unit.

Alternatively or in addition to the another first measurement, the processing unit may decide to execute a second measurement using a second sensor. Accordingly, the method may comprise the steps of:

performing a second measurement using a second sensor;

calculating, using the processing unit, a second distance value from the second measurement; the second distance value being indicative of the distance between the user and the electronic device;

calculating, using the processing unit, a second quality factor related to the second measurement;

dependent upon the second quality factor, deciding if the processing unit adapts the energy level.

In light of the previous discussions regarding quality factors, it will be understood that the second quality factor here represents a reliability or confidence related to the second measurement.

Thus, according to an aspect, if the second quality factor meets a second criterion, the processing unit adapts the energy level in relationship to, or dependent upon, the second distance value. Accordingly, the method further comprises the step:

If the second quality factor meets a second criterion, adapting the energy level through the processing unit.

It will be understood that various alternatives that were discussed regarding the first measurement apply not only to the another first measurement, but also to the second measurement. Also, as discussed previously, the second criterion may also be a probability or confidence limit or value.

Similar to the above, according to an alternative aspect, if the second quality factor does not meet the second criterion, the processing unit does not adapt the energy. Accordingly, the method further comprises the step:

If the second quality factor does not meet the second criterion, unaffecting the energy level through the processing unit.

Steps related to the another first measurement also apply to the measurements using the second sensor. Accordingly, without having to repeat, the method steps shown above for the another first measurement also apply, and are herein sufficiently disclosed, for performing an another second measurement using the second sensor. Accordingly, an another second quality factor may be calculated and evaluated by the processing system for deciding if the energy level is to be altered or adapted.

Furthermore, the steps related to the calculation and use for the overall quality factor also apply to any combination of the measurements disclosed herein, e.g., a combination of the first measurement with the second measurement, or a combination of the first measurement, and the another first measurement, with the second measurement, or a combination of the first measurement, and the second measurement, with the another second measurement.

It will also be understood that the another first measurement may be followed by yet another first measurement, and so forth, thus forming a set of first measurements, for improving the overall quality factor. Similarly, such a set of second measurements is also possible and herein disclosed. Alternatively to or in addition to the another first measurement, or the second measurement, the method may include analyzing data from any one or more of the available sensors in the electronic device, such as: IR sensor, inertial sensor, camera, and ambient light sensor. Such an analysis may be used to estimate the use case of the electronic device, and/or improving the one or more quality factors discussed in this disclosure.

It will be appreciated that at least some of the present teachings can provide power savings in the electronic device at least by performing just as many measurements as required in a given situation to resolve the presence of a user in the vicinity of the electronic device such that SAR requirements can be met. In addition, an ultrasound system according to the present teachings can provide a proximity detection system that is especially suitable for electronic devices (e.g., mobile phones) with a minimalistic bezel. Furthermore, synergy between measurements from other available one or more sensors in the electronic device can be used for not only improving the quality of the measurements, but also minimizing the measurements required for reliable proximity and distance detection. Also, at least in some cases, the emittance of energy from the electronic device may even be controlled in relationship with the distance of the user from the device. In some cases, a dedicated SAR sensor is placed within the electronic device. Not only will such a dedicated SAR sensor usually require space within the electronic device, but also require power and routing of electrical connections on the PCB. The present teachings can also provide a method and a measurement system that may not require a dedicated SAR sensor. Moreover, in cases where an ultrasound system is already used for proximity detection and/or gestures, the same ultrasound system can be configured to also perform SAR measurements. This can further reduce power and space requirements in the electronic device. Furthermore, the present teachings at least in some cases can simplify production and reduce the cost of the electronic device.

As was also discussed previously, the transmitter and receiver may either be different components or alternatively can be the same transducer being used in a transmit mode for transmitting the ultrasound signal and then in a receive mode for receiving the reflected ultrasound signal. If the transmitter and receiver are separate components, they may be placed in the same location, or they may be installed at different locations on the electronic device. Furthermore, the electronic device may comprise a plurality of transmitters and/or a plurality of receivers. Multiple transmitter-receiver combinations may be used to extract spatial information related to the object and/or surroundings.

The processing unit is a computer or data processor such as a microprocessor or microcontroller. The processing unit may be a combination of different hardware components or modules. In some cases, the processing unit may essentially be a virtual machine running on a processor. In some cases, the processing unit may also include a machine learning module for improving the accuracy of measurements over use cases of the electronic device. The processing unit may further include an artificial intelligence ("AI") module.

The electronic device may be any device, mobile or stationary, which is required to satisfy SAR criteria. Accordingly, devices such as mobile phones, tablets, voice assistants, smart speakers, notebook computers, desktop computers, and similar devices fall within the ambit of the term electronic device. In addition, devices such as internet routers, vending machines, video games, automobiles, gates, doors, home appliances, and other kinds of electronic systems that rely upon transmission of electromagnetic energy (such as RF) also fall within the ambit of the term.

In some cases, the method may involve the processing system selecting certain ultrasound transmitter/receiver combinations that can provide a spatial resolution that is improved at least in a certain area of the field of view of the ultrasound sensor. The range and/or sensitivity of the sensors may either be limited according to component specifications, or it may be statically or dynamically set to a certain values according to processing requirements. Accordingly, the range the and/or sensitivity may be adjusted in one or more scenarios such as: adapting to input objects of different sizes, received signal strength or quality of the signal received by one or more receivers, amount of noise in the surroundings or varying signal-to-noise ("SNR") conditions, etc.

In some cases, when the computed distance value is shorter than a distance threshold value, the processing unit may switch further ultrasound sensors in the electronic device for capturing a better spatial view.

According to another aspect, the method may also comprise estimating a movement of the user relative to the electronic device by transmitting a stream of ultrasound signals and by computing a trajectory of the user by combining the computed distance values associated with a stream of reflected ultrasound signals from the user. In other words, the stream or sequence of transmitted ultrasound signals results in a stream or sequence of ultrasound signals reflected from the user, for each reflected signal in the stream of ultrasound signals received by the receiver, a corresponding measured signal is generated, thereby resulting in a stream of measured signal values. The stream of measured signals can be used to estimate the trajectory of the user. The estimated trajectory may also be used to compute a projected trajectory of the user, the projected trajectory being a probabilistic estimate of the future movement of the user based upon the estimated trajectory. The processing unit may then use the estimated trajectory for controlling the measurements, e.g., frequency, and/or using data from other sensors. Other sensors may include any one or more of the available sensors in the electronic device, such as: IR sensor, inertial sensor, accelerometer, camera, and light sensor.

The processing of the echo signal may be based on time of flight ("TOF") measurements between the transmitted ultrasound signal and the corresponding measured signal. The processing of the echo signals may also be based on the amplitude of the measured signal, or phase difference between the transmitted signal and the measured signal, or the frequency difference between the transmitted signal and the measured signal, or a combination thereof. The transmitted ultrasound signal may comprise either a single frequency or a plurality of frequencies. In another embodiment, the transmitted ultrasound signal may comprise chirps.

Viewed from another perspective, the present teachings can also provide an electronic device implementing the embodiments or any of the method steps herein disclosed.

More specifically, an electronic device can be provided, the electronic device comprising a measurement system configured to control an energy level on the electronic device, said energy level being related to the Specific Absorption Rate ("SAR"), wherein the measurement system comprises a first sensor configured to generate a first signal;
a processing unit configured to calculate a first distance value from the first signal, the first distance value being indicative of the distance between a user and the electronic device; wherein
the processing unit is configured to adapt the energy level on the electronic device in response to the first distance value, such that predefined SAR requirements due to exposure of emitted energy from the electronic device are met for the user.

Similar to the discussions for the method according to the present teachings, the first sensor may be an ultrasound sensor. In such cases, the measurement system comprises an ultrasound sensor comprising at least one transmitter and at least one receiver, wherein an ultrasound transmitter is configured to transmit an ultrasound signal, and an ultrasound receiver is configured to generate a measured signal by receiving an echo of the ultrasound signal being reflected by an object; wherein the first distance value is obtained by processing the measured signal.

In other cases where another kind of sensor is also used, such as a capacitive sensor, the measurement system comprises another sensor, such as a capacitive sensor, configured to perform the first measurement by generating an electrical signal indicative of the distance between a user and the electronic device; and the processing system is configured to calculate the first distance value by processing the electrical signal.

Similarly, method steps for improving measurement reliability by calculating quality factor also applies to the electronic device according to the present teachings.

As previously discussed, the processing unit can be any type of computer processor. The processing unit may be even be a DSP, an FPGA, or an ASIC.

Viewed from yet another perspective, the present teachings can also provide a computer software product for implementing any method steps disclosed herein. Accordingly, the present teachings also relate to a computer readable program code having specific capabilities for executing any method steps herein disclosed. In other words, the present teachings relate also to a non-transitory computer readable medium storing a program causing an electronic device to execute any method steps herein disclosed.

Example embodiments are described hereinafter with reference to the accompanying drawings. Drawings may not necessarily be drawn to scale, without that affecting the scope of generality of the present teachings.

DETAILED DESCRIPTION

Figure 1:
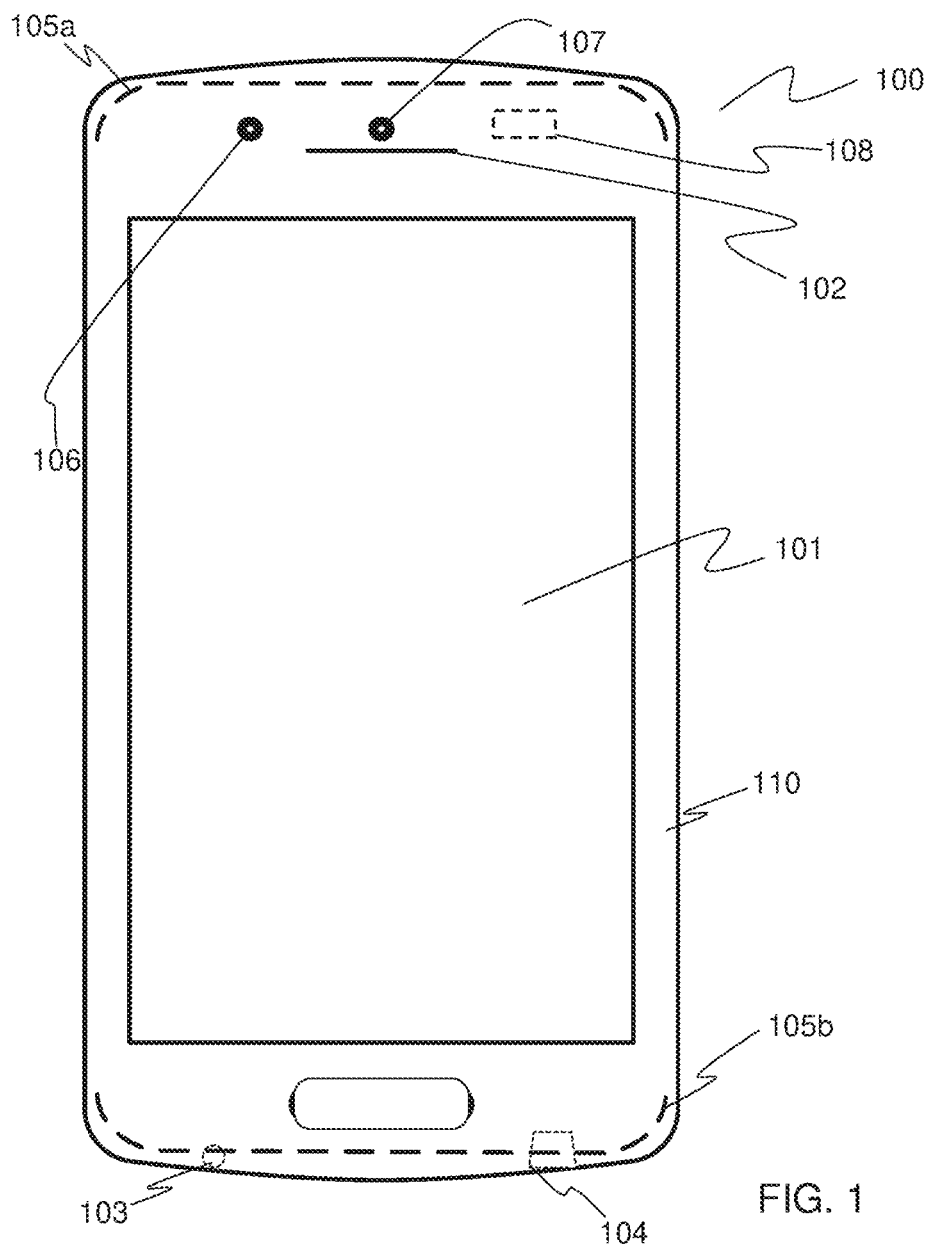
FIG. 1 shows a mobile phone comprising a SAR sensor

FIG. 1 shows an example of an electronic device 100, which is illustrated as a mobile phone. The perspective view shown in FIG. 1 essentially shows a view of the screen-side of the phone. The phone 100 has a screen 101 for displaying visual content. The screen 101 in most cases also includes a touchscreen sensor (not explicitly shown). The phone 100 also has antennae 105 that are located inside the body of the phone 100. Top antenna 105a is located on the top side of the phone 100, whereas the bottom antenna 105b is location on the bottom side of the phone 100. Near the top side of the phone 100 is also an earpiece 102, an IR sensor, and a camera 107. The earpiece 102 is usually a speaker for converting electrical signals to sound. On the bottom side of the phone 100 are also located another speaker 104 and a microphone 103. Some phones or electronic devices may have multiple microphones. Moreover, some devices may even have a plurality of speakers for stereophonic playback. The speaker 104 is usually used for handsfree operation and for playing audio. The phone 100 also has a dedicated SAR sensor 108 which is located close to the top antenna 105a. The phone 100 will usually have another SAR sensor (not shown) that is located close to the bottom antenna 105b. As can be appreciated, the SAR sensor(s) 108 and the IR sensor 106 can take appreciable space not only on the screen side, but also inside the body of the phone 100. The phone 100 shown is a type with relatively wide bezel 110, which may generally refer to the space around the screen 101.

There is a steady push in the market for reducing such dead-space around the screen 101 such that the screen 100 and thus the display may be stretched as much as possible until the edges of the screen-side of the phone.

Figure 2:
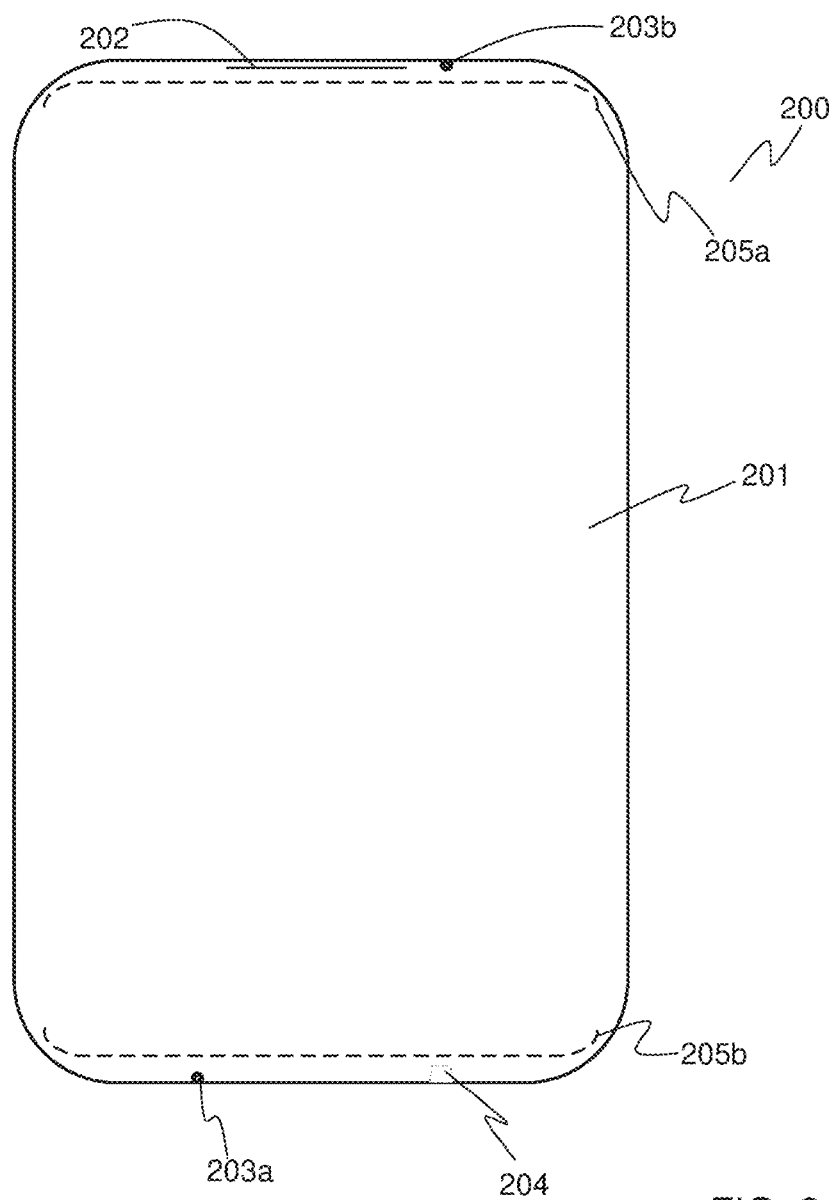
FIG. 2 shows a mobile phone with a thin bezel

FIG. 2 shows a second phone 200 with very thin or essentially invisible bezel. Such a phone 200 is also known as a bezel-less phone. The second phone 200 also has a screen 201 that extends almost to the edges of the phone 200. An earpiece 202 is located at the top side. The second phone 200 is shown as having two microphones 203, first microphone 203a located on the bottom side, and the second microphone 203b located on the top side. A speaker 204 is also shown. The second phone 200 also has two antennae 205, each located inside the phone 200 on the top side and bottom side respectively. As can be seen, it can be a challenge to place additional components such as an IR sensor and an SAR sensor in the second phone 200.

Figure 3:
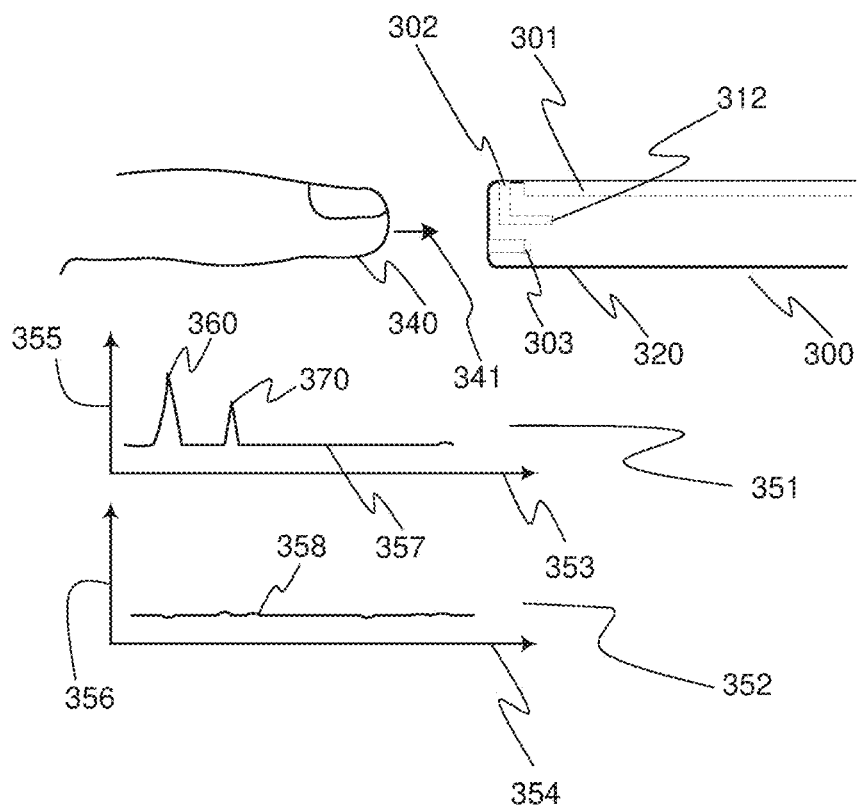
FIG. 3 shows an example of proximity detection with a finger approaching the electronic device

FIG. 3 shows a section 300 of a perspective side-view of an electronic device. The electronic device has a body 320 and a display or screen 301 that includes a capacitive touchscreen sensor. An earpiece 302 is shown in an "L" shape, which may correspond to a hollow channel that leads to an opening for outputting acoustic signals towards the side of the screen 301. The other end 312 of the channel a speaker is located for generating the acoustic signals. Also, a microphone 303 is shown inside the device at an end of yet another channel with an opening at the body of the device for receiving acoustic signals. Usual purpose of a microphone and an earpiece is known to a skilled person, but it is also discussed previously in this disclosure. In this case, however, the microphone 303 and the earpiece also function as an ultrasound sensor. As it will be appreciated, the earpiece 302 or more specifically the earpiece speaker is what can be called an ultrasound transmitter, and the microphone 303 an ultrasound receiver. It can be noted that the ultrasound transmitter and/or the ultrasound receiver could even be implemented as separate components from the audio speaker and the audio microphone without diverting from the scope of the invention. However, it can be an advantage in terms of reduced number components if the earpiece 302 and the microphone 303 are used also as ultrasound sensor.

FIG. 3 also shows a couple of plots 351 and 352 that correspond to responses related to an ultrasound measurement, and a capacitive measurement, respectively. The capacitive measurement 352 shown is being performed by the capacitive touchscreen sensor. Both measurements are shown as concurrent, i.e., occurring at the same time, for demonstrating how sensor responses according to the present teachings may complement each other. The responses 351 and 352 pertain to an example use case where a finger 340 of a user is approaching in a direction 341 towards the device 300. The Y-axes 355 and 356 represent a measured signal of the ultrasound measurement 351 and the capacitive measurement 352 respectively. The signal may be measured by measuring amplitude, power, or other relevant parameter. In the plots shown, the ultrasound measurement X-axis 353 is drawn to represent time, whereas the capacitive measurement X-axis 354 is drawn to represent a distance on screen. This is done to better visualize the signals occurring in the respective measurements.

As can be seen, the response 358 of the capacitive measurement 352 is relatively flat as compared to the response 357 of the ultrasound measurement 351 that shows two distinct peaks 360 and 370. The first peak 360 is occurring due to a direct path between the transmitter and the receiver, i.e., due to the transmitted signal being directly coupled to the receiver. The second peak 370 is due to the echo received from the finger 340. It will be understood that the distance from the device to the moving finger is proportional to the time difference between peaks 360 and 370. Since, the touchscreen sensor here is unable to detect the proximity of the finger 340, in such a case, a proximity detection by the ultrasound sensor may be used to control an energy level on the electronic device 300 such that SAR requirements are met. In this case, for example, the device 300 may reduce the RF energy in relationship to the distance of the finger 340 from a given reference point on the device 300, or more specifically from the ultrasound sensor. As the finger 340 comes closer to the device 300, the device using its processing unit may proceed or continue reducing its EM emission (RF field), such that SAR parameters remain within limits even though the user is closer to the device. This may be done, in a simple case, in a single step, or it may be done in multiple discrete steps, or even continuously by tracking the movement of the user or their body part 340 closest to the device 300.

The ultrasound measurement may also involve calculating a quality parameter or a quality factor for the measurement performed by the processing unit. If the quality factor satisfies a given criterion or a given criteria, the ultrasound measurement itself is deemed sufficient to adapt the energy level. Alternatively, the processing unit may either proceed to perform another ultrasound measurement, or it may rely upon data from other sensors available in the electronic device 300. The processing unit may even combine different measurements to improve the confidence or one or more quality factor.

The processing unit may also be configured to analyze the received acoustic signal from the user or object close by the user so as to distinguish between the user and other objects. This may be obtained by analyzing, the received ultrasound signal so as to calculate the characteristics of the reflecting material based on the shape and attenuation of the received ultrasound signal, such as evaluating the attenuation and dispersion of the received acoustic signals. For example an object measured to be close by the device would result in different signal strengths as well as frequency characteristics that could be used as a indication of skin as compared to a hard object.

Figure 4:
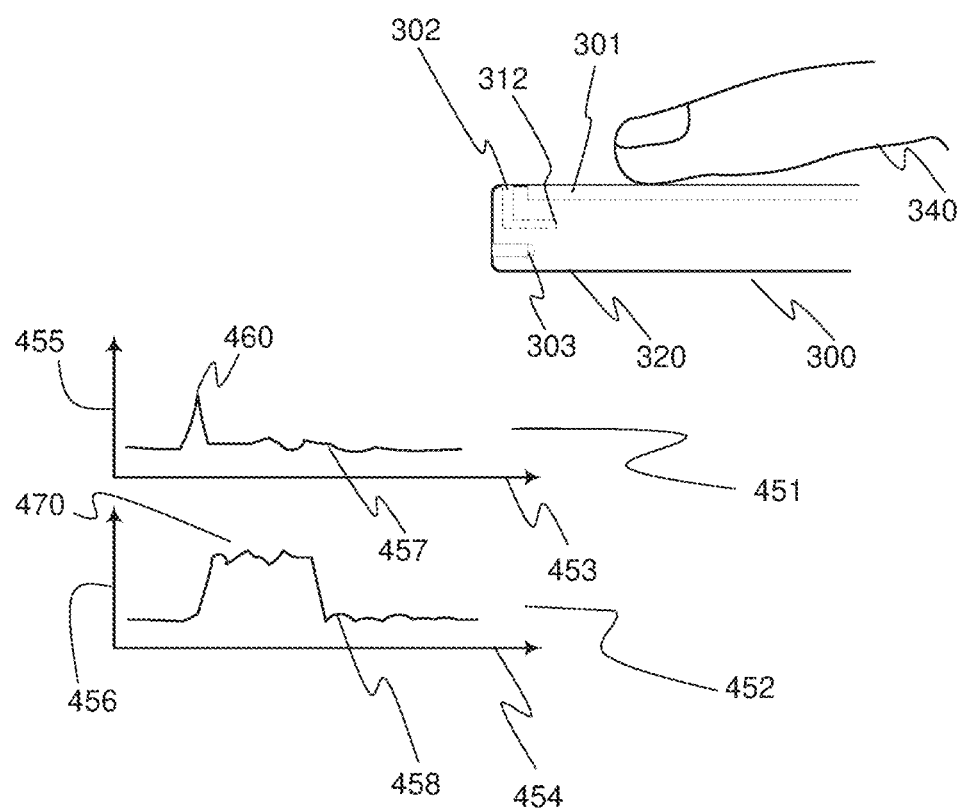
FIG. 4 shows an example of proximity detection with a finger resting on the touchscreen of the electronic device

FIG. 4 shows another example scenario when the finger 340 is resting on the touchscreen 301 of the device 300. Plots from an ultrasound measurement 451 and a capacitive measurement 452 are also shown. In this case, the touchscreen sensor is providing a strong response which is visible as an elevated portion 470 of the capacitive measurement 458. The ultrasound measurement 457 now shows only one peak 460, corresponding to the direct path, and the subsequent echoes are generally weaker as compared to the case in FIG. 3, where the finger 340 was well within the field of view of the ultrasound sensor. In such cases, according to present teachings, a response from the touchscreen sensor alone may be sufficient for the processing unit to control the energy level such that SAR parameters remain within predetermined limits.

Figure 5:
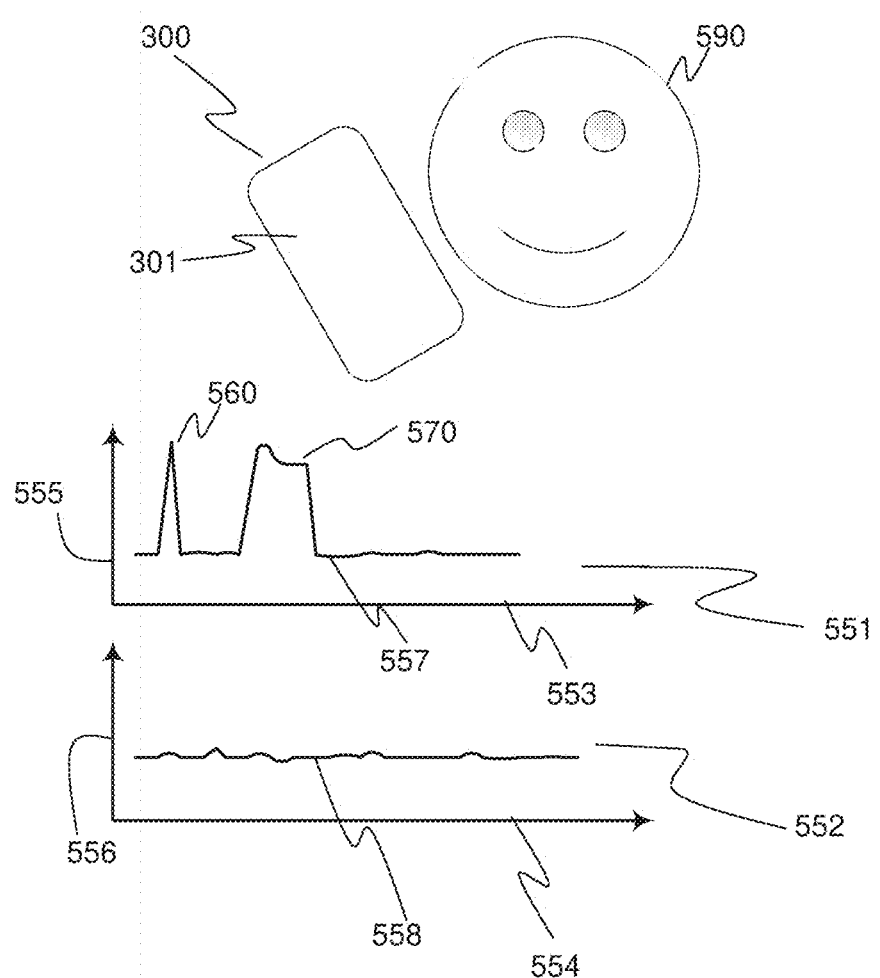
FIG. 5 shows a case when the electronic device is held close to a user's head

FIG. 5 shows a case when the electronic device 300, shown as a phone brought and held close to, but not in contact with a user's head 590. The distance between the user's head 590 and the phone 300 in this case may be of the order of an inch (approx. 25 mm) or so. Capacitive measurement 552 and ultrasound measurement 551 in this case is also shown in FIG. 5. Since the screen 301 is not in physical contact with the head 590, the response 558 of the touchscreen sensor measurement 552 is quite flat. Ultrasound measurement 551 on the other hand shows a relatively strong response that is visible by an elevated portion 570 of the ultrasound response 557, in addition to the direct path 560. The response 570 in this case is not a clear peak because the receiver receives multiple echoes from the user's head e.g. the ear, the cheek, the jaw, the scalp etc. This case is also an example, where the ultrasound measurement may provide sufficiently high confidence such that the energy level may be controlled appropriately.

In addition, the measurement system may detect response from other sensors for improving or verifying the quality factor. As an example, in this case data from an inertial sensor and/or accelerometer and/or even magnetometer (compass) may be used to verify the movement induced in the device.

In certain cases, ultrasound sensors may have difficulty in detecting stationary objects or reliably detecting very slow moving objects or objects that have become stationary for longer periods. In such cases, other sensors may provide a more unambiguous response that may be used to control the energy level. An example of such a case is when the user is holding the phone against their head for attending a call. If the device is held relatively stationary with respect to the head for long periods of time, the ultrasound sensor may have difficulty in detecting the head.

Figure 6:
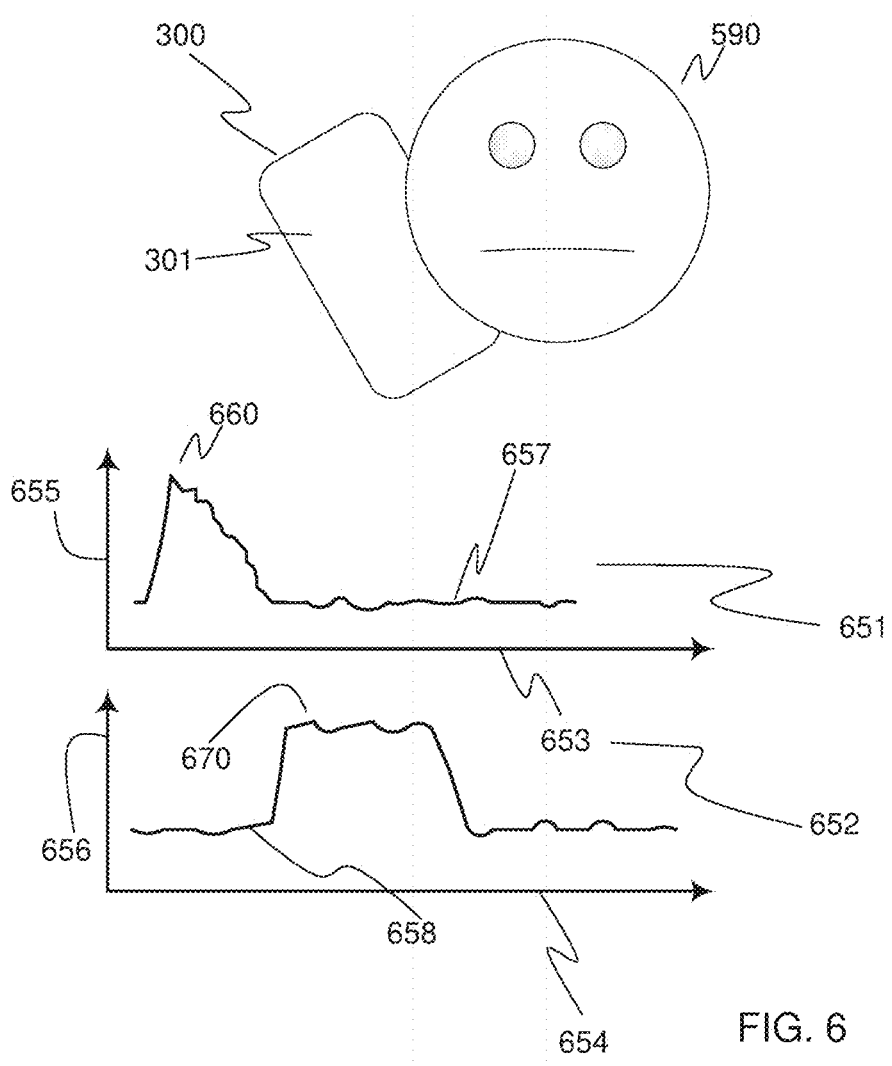
FIG. 6 shows a case when the electronic device is put against the user's head

FIG. 6 shows such a case where the phone 300 is resting against the user's head 590. Corresponding capacitive measurement 652 and ultrasound measurement 651 also shown in FIG. 6. As can be seen the response 657 of the ultrasound measurement 651 dies out gradually after the direct path peak 660. Due to insufficient movement between the phone 300 and the head 590, the ultrasound response after peak 660 may not provide a clear indicator of whether there is a reflector or object present or not. In contrast, the touchscreen response 658 provides a distinct peak portion 670 corresponding to the region of the screen in contact with the head. It should be noted that in most cases there will be at least micromotions between the phone 300 and the head 590, so if the ultrasound sensor has such resolution that such movements may be resolved, the ultrasound response will still be available. In this case it is assumed that the ultrasound system cannot resolve very small movements either due to specifications or noise. The touchscreen sensor, on the other hand, typically has a high sensitivity in contact region on the screen, so it may be relied upon for reliable long term contact especially with small movements.

Figure 7:
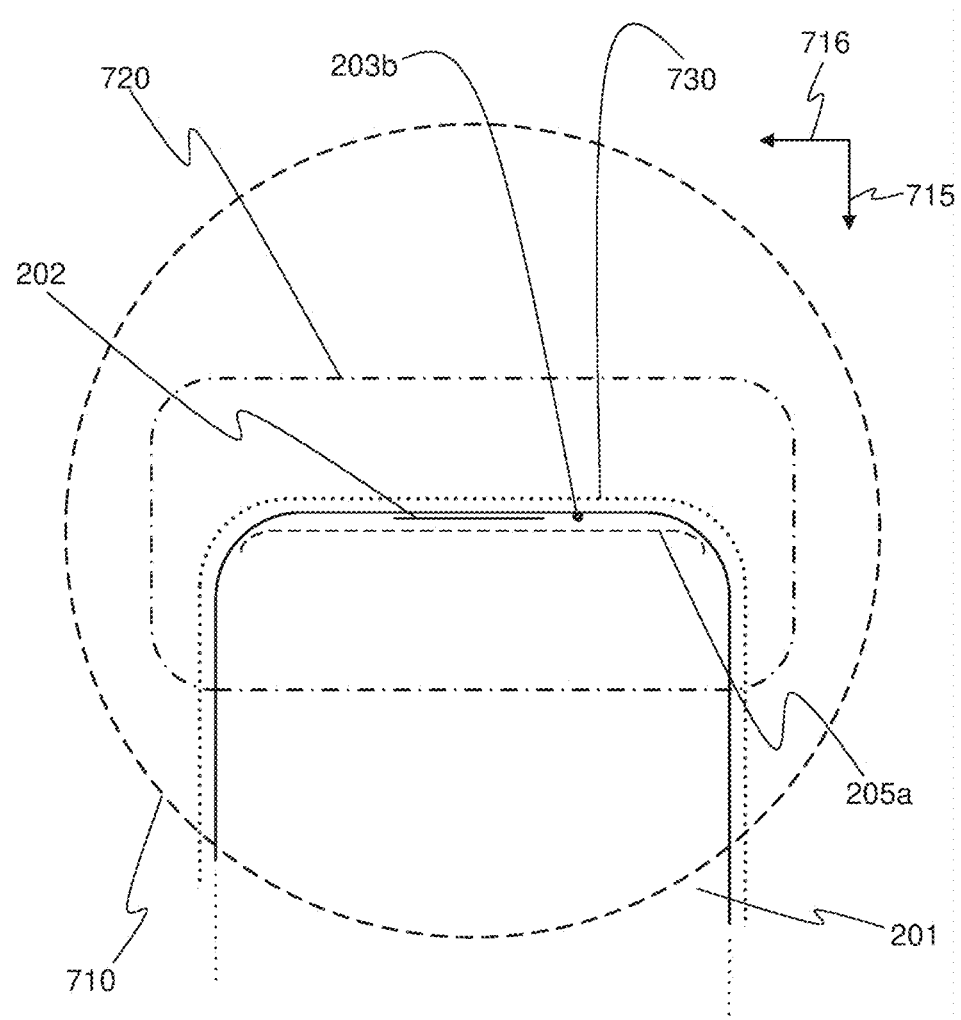
FIG. 7 shows a representation of detection regions around the top-side of a phone

FIG. 7 shows a representation of various detection regions for a top section of the example electronic device 200 that that shown in FIG. 2. Ultrasound detection region 710 is shown in this example in the form of a circle. It will be understood that while FIG. 7 is a two-dimensional view along an X-dimensional axis 716 and a Y-dimensional axis 715, in reality at least some of the detection regions will resemble a 3-dimensional ("3D") space around the respective sensors within which a detection is desired or is possible. The depiction of these regions in FIG. 7 can nevertheless be helpful in understanding how ultrasound measurements according to the present teachings may be advantageous in helping with conformance to desired SAR levels. SAR detection region 720 is shown as a rounded rectangle, which is shown essentially centered around the top antenna 205a of the device 200. The SAR detection region 720 represents a region within which should an object, such as a body part of the user, be present, at least one energy parameter or energy level of the device 200 must be controlled such that SAR requirements are met for the body part.

At a short distance from the periphery of the device is shown a capacitive detection region 730 that represents detection range for the touchscreen sensor. As it may be appreciated, the SAR detection region 720 extends well beyond the capacitive detection such that relying only upon the capacitance detection by the touchscreen will not be sufficient to meet the SAR requirements for an object that is within the SAR region 720, but outside the capacitance detection region 730.

In such cases, the ultrasound detection region can provide not only proximity information, but also distance value of the object. The proximity and/or distance information of the object may then be used to control the energy level such that SAR requirements are met.

FIG. 7 shows a more ideal overview of the regions when it comes to how said regions are located with respect to each other, while in reality the placement of sensors can determine how the respective regions will extend along each axis in a 3D space. The regions in reality may not be symmetrical. They may be more asymmetrical, but it does not affect the scope or generality of the present teachings. By component placement, desired location of each respective region with respect to the others may be achieved.

Figure 8:
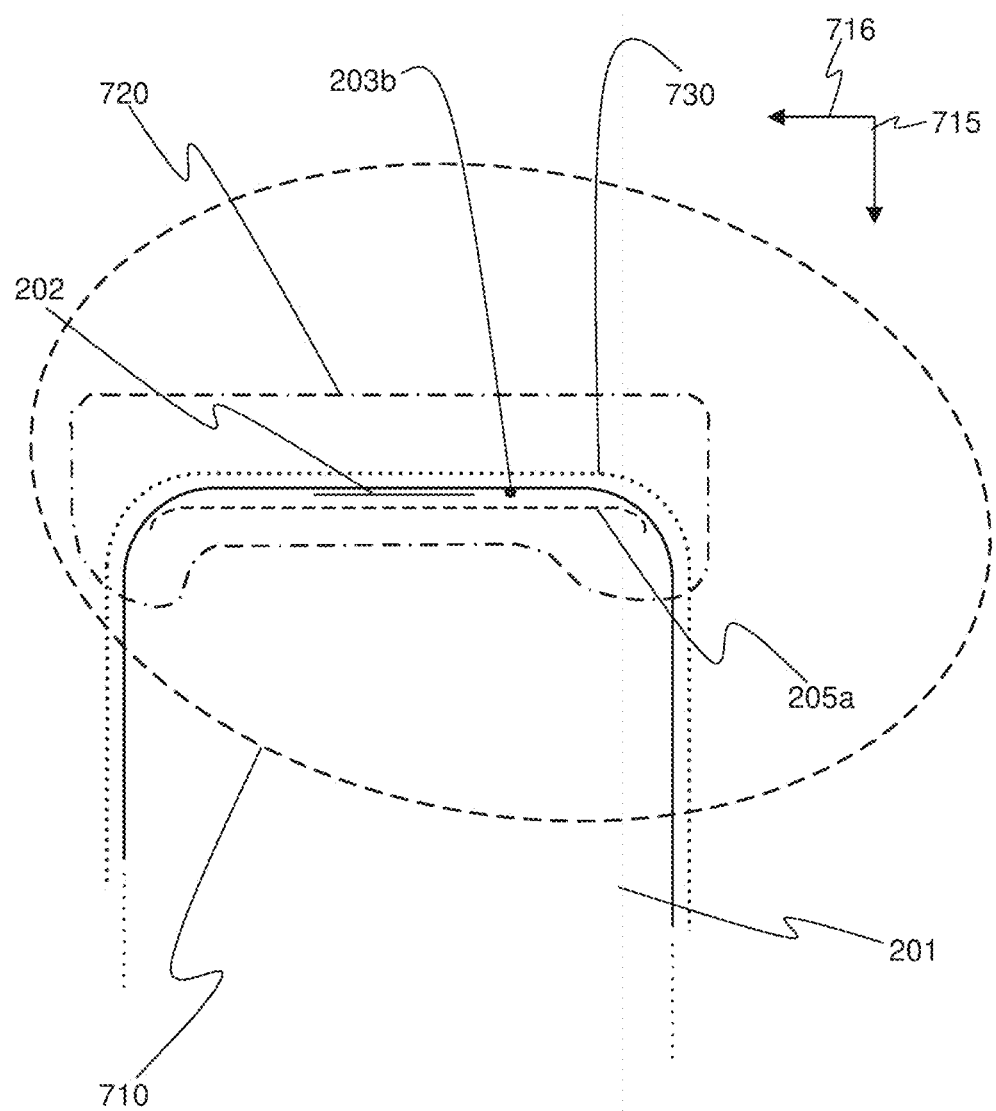
FIG. 8 shows a representation of irregular detection regions

FIG. 8 shows a more realistic representation of the various regions discussed in FIG. 7, especially in light of the placement of the earpiece 202 with respect to the top-side microphone 203b. The ultrasound detection region 710 resembles more of an ellipsoid rather than a circle in this case. The ellipsoid 710 is somewhat rotated and essentially centered around the microphone 203b, as a result the ultrasound detection region 710 is shifted towards the right in the figure along the X-axis 716. Specific shape of the detection region may vary from application to application, as discussed previously, where it will depend amongst other things upon the respective acoustic channels that couple the ultrasound sensor (202, 203b) to the body of the device. Even though the ultrasound region shown in FIG. 8 is not symmetrical, it still may be enough for the proposed detection in many applications especially if it encompasses the SAR detection region 720. SAR detection region is also drawn irregular in FIG. 8 to show that it will depend upon the antenna shape, etc. The skewness in the ultrasound detection region 710 in this case is mostly due to the earpiece 202 (ultrasound transmitter) being located essentially in the middle of the top-side of the phone 200, and the top-side microphone 203b being located on the right side. If the phone 200 also has an ultrasound sensor in the bottom-side of the phone, the shape of the ultrasound detection region may be different depending upon how the transmitter and the receiver are arranged on the bottom-side.

Figure 9:
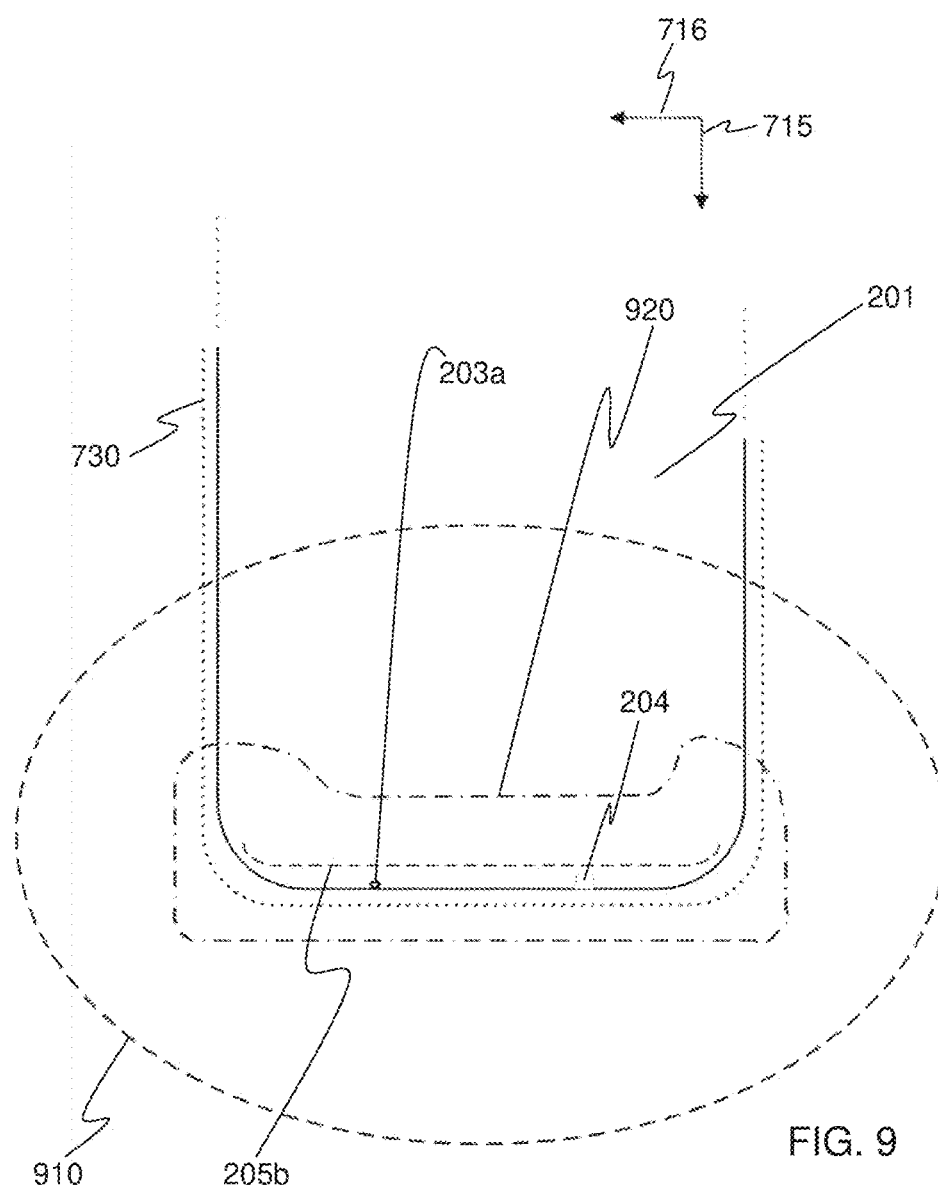
FIG. 9 shows a representation of the detection regions around the bottom-side of the phone

FIG. 9 shows a representation of the various detection regions on the bottom-side of the phone 200. The ultrasound sensor on the bottom-side is realized with the speaker 204 and the bottom-side microphone 203a. Since the speaker 204 and the bottom-side microphone 203a are located essentially symmetrical along the bottom-side edge, the associated ultrasound detection region 910 is more symmetrical around the mid-point of the bottom edge and essentially symmetrically encompasses the bottom side SAR detection region 920.

It will be understood that by proper component design, the ultrasound detection region may be defined to extend in desired directions around one or more antennae in the electronic device. Moreover, the extent by which the ultrasound detection region extends beyond or encompasses the SAR detection region can also be defined in the design for a specific electronic device as per requirements. Furthermore, the ultrasound region may be dynamically restricted or extended around the SAR detection region as per use case. For example, in certain use cases, it might be desirable to detect proximity more closer to the SAR detection region. The ultrasound region may thus be restricted, either through the ultrasound sensor, and/or through the processing unit, e.g., by ignoring proximity events that occur beyond a given limit in the ultrasound detection region. In other cases, a detected of farther objects might be required, in which case the ultrasound region may be extended equivalently.

Figure 10:
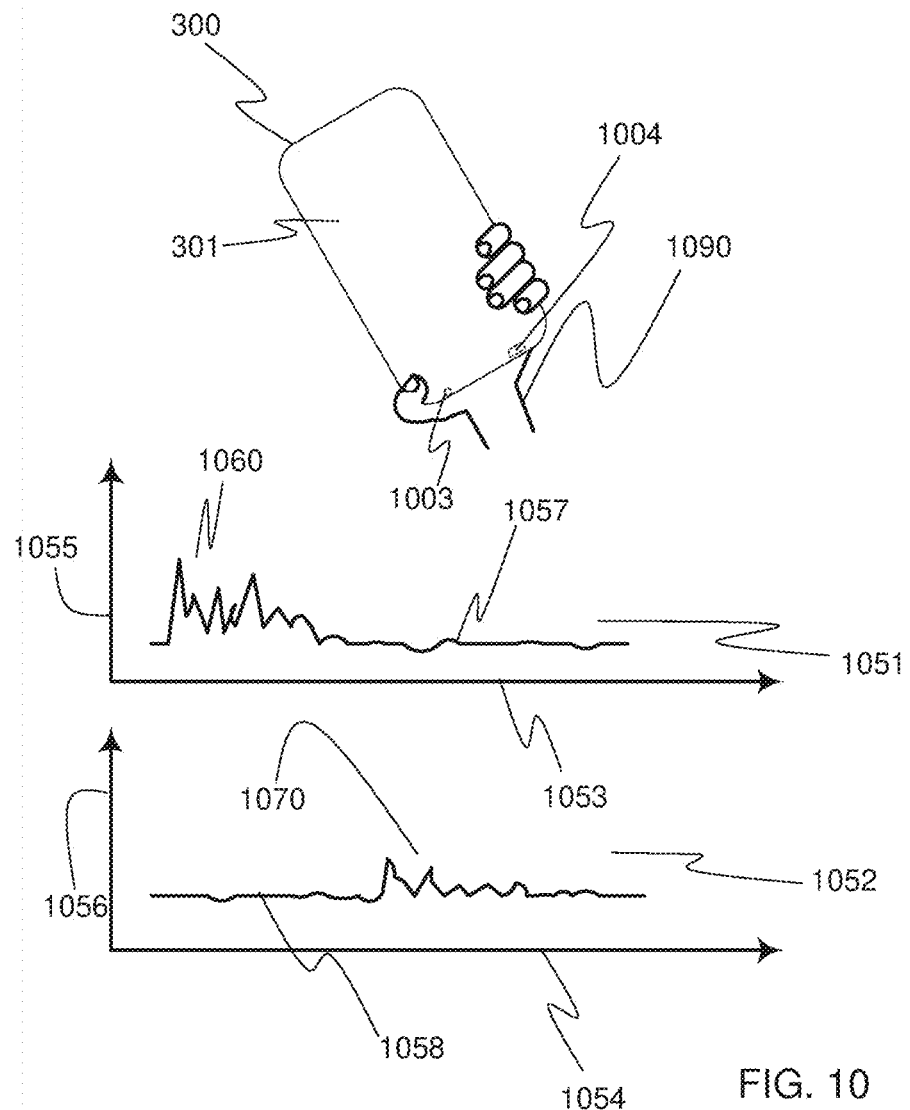
FIG. 10 shows an example of a use case when neither of the detections are reliable

FIG. 10 shows a use case where neither the ultrasound detection nor the touchscreen detection is reliable. Reference is also made especially to FIGS. 3-6, where a few other use cases were discussed. In FIG. 10, the phone 300 is held in a hand 1090 of a user. Since the phone is being held in the SAR region of the bottom-side antenna, ultrasound measurement 1051 is shown for the bottom-side ultrasound sensor which comprises the speaker 1004 and the bottom-side microphone 1003. The ultrasound response 1057 does not show any clear peak, rather a mixture of peaks 1060, as ultrasound signal is reflected or from several parts of the hand 1090 such as fingers, wrist, and thumb. Touchscreen 301 is also having problems in detecting a clear touch event as the fingers and thumb are gripping the phone 300 along the edges. As a result, the response 1058 is also weak with a scattered response 1070. In such cases, the ultrasound response 1057 may be analyzed by the processing unit in relationship with the touchscreen response 1058 for recognizing the use case and thus adapting the energy level such that SAR requirements are met. As discussed previously, other sensor data may also be analyzed if further improvement in a quality factor is needed. The processing unit may, for example, correlate the ultrasound response relative to the touchscreen response and/or other sensor data for recognizing a specific use case. As in the cases above, X-axis 1053 is drawn to represent time, whereas the capacitive measurement X-axis 1054 is drawn to represent a distance on the screen 301.

Similarly, other use cases may be recognized by the processing unit, such as electronic device in a pocket, in which case capacitive response will usually be strong and spread wide across the screen, correlated with an ultrasound response essentially similar to that shown in FIG. 10. Another example is when the electronic device is in a bag, in which case capacitive response will usually be poor and ultrasound response will typically show several reflections.

In some electronic devices, where multiple microphones and/or speakers are located close to an antenna, different transmitter—receiver combinations may further be used to spatially resolve positions of one or even multiple objects.

Various embodiments have been described above for a method for proximity detection on an electronic device, and for an electronic device such a proximity detection system or measurement system. Those skilled in the art will understand, however that changes and modifications may be made to those examples without departing from the spirit and scope of the following claims and their equivalents. It will further be appreciated that aspects from the method and product embodiments discussed herein may be freely combined.

Certain embodiments of the present teachings are summarized in the following clauses.

Clause 1.

A method for proximity detection on an electronic device, the method comprising the steps of:
performing a first measurement using a first ultrasound sensor;
calculating, using a processing unit, a first distance value from the first measurement; the first distance value being indicative of the distance between a user and the electronic device;
in response to the first distance value, through the processing unit, adapting an energy level on the electronic device, said energy level being related to the Specific Absorption Rate ("SAR"), such that predefined SAR requirements due to exposure of emitted energy from the electronic device are met.

Clause 2.

The method according to clause 1, wherein the method further comprises the steps of:
performing the first measurement by: transmitting an ultrasound signal from an ultrasound transmitter, and by generating a measured signal by receiving, at an ultrasound receiver, an echo of the ultrasound signal being reflected by an object;
calculating the first distance value by processing the measured signal.

Clause 3.

The method according to clause 1, also including a capacitive sensor, and the method further comprises the steps of:
performing the first measurement by generating an electrical signal using another sensor, the electrical signal indicative of the distance between a user and the electronic device;
calculating the first distance value by processing the electrical signal.

Clause 4.

A method for proximity detection on an electronic device, the method comprising the steps of:
performing a first measurement using a first ultrasound sensor;
calculating, using a processing unit, a first distance value from the first measurement; the first distance value being indicative of the distance between a user and the electronic device;
calculating, using the processing unit, a first quality factor related to the first measurement;
dependent upon the first quality factor, deciding if the processing unit adapts an energy level on the electronic device in relationship to the first distance value; wherein said energy level is related to the Specific Absorption Rate ("SAR"), such that predefined SAR requirements due to exposure of emitted energy from the electronic device are met.

Clause 5.

The method according to clause 4, wherein the method further comprises the step of:
adapting the energy level through the processing unit if the first quality factor meets a first criterion.

Clause 6.

The method according to clause 4, wherein the method further comprises the step of:
unaffecting the energy level through the processing unit if the first quality factor does not meet a first criterion.

Clause 7.

The method according to clause 6, wherein the method further comprises the steps of:
performing an another first measurement using the first sensor;
calculating, using the processing unit, an another first distance value from the another first measurement; the another first distance value being indicative of the distance between the user and the electronic device;
calculating, using the processing unit, an another first quality factor related to the another first measurement;
dependent upon the another first quality factor, deciding if the processing unit adapts the energy level on the electronic device.

Clause 8.

The method according to clause 7, wherein the method further comprises the step of:
adapting the energy level through the processing unit if the another first quality factor meets the first criterion.

Clause 9.

The method according to clause 7, wherein the method further comprises the step of:
unaffecting the energy level through the processing unit if the another first quality factor does not meet the first criterion.

Clause 10.

The method according to any of the clauses 5-9, wherein the first criterion comprises a probability value indicative of that the first distance value is accurate above a predetermined limit.

Clause 11.

The method according to any of the clauses 7-10, wherein the method further comprises the steps of:
processing, using the processing unit, the first measurement in relationship with the another first measurement;
calculating, using the processing unit, an overall quality factor related to the first measurement and the another first measurement;
dependent upon the overall quality factor, deciding if the processing unit adapts the energy level on the electronic device.

Clause 12.

The method according to clause 11, wherein the method further comprises the step of:
adapting the energy level through the processing unit if the overall quality factor meets an overall criterion.

Clause 13.

The method according to clause 11, wherein the method further comprises the step of:
unaffecting the energy level through the processing unit if the overall quality factor does not meet an overall criterion.

Clause 14.

The method according to any of the clauses 6-13, wherein the method further comprises the steps of:
performing a second measurement using a second sensor;
calculating, using the processing unit, a second distance value from the second measurement; the second distance value being indicative of the distance between the user and the electronic device;
calculating, using the processing unit, a second quality factor related to the second measurement;
dependent upon the second quality factor, deciding if the processing unit adapts the energy level.

Clause 15.

The method according to clause 14, wherein the method further comprises the step of:

adapting the energy level through the processing unit if the second quality factor meets a second criterion.

Clause 16.

The method according to clause 14, wherein the method further comprises the step of:
  unaffecting the energy level through the processing unit if the second quality factor does not meet a second criterion.

Clause 17.

The method according to the clauses 7-16, wherein the method further comprises the steps of:
  processing, using the processing unit, the second measurement in relationship with the first measurement and/or the another first measurement;
  calculating, using the processing unit, the overall quality factor related to the second measurement and the first measurement and/or the another first measurement;
  dependent upon the overall quality factor, deciding if the processing unit adapts the energy level on the electronic device.

Clause 18.

The method according to any of the clauses 11-17, wherein at least one of the overall criterion, and the second criterion comprise an individual probability value indicative of that the respective the another first distance value and/or the second distance value is/are accurate above their respective predetermined limit.

Clause 19.

The method according to any of the clauses 4-13, wherein the first sensor is an ultrasound sensor, and the method further comprises the steps of:
  performing the first measurement by: transmitting an ultrasound signal from an ultrasound transmitter, and by generating a measured signal by receiving, at an ultrasound receiver, an echo of the ultrasound signal being reflected by an object;
  calculating the first distance value by processing the measured signal.

Clause 20.

The method according to any of the clauses 14-18, wherein the second sensor is a capacitive sensor, and the method further comprises the steps of:
  performing the second measurement by generating an electrical signal using another sensor, the electrical signal indicative of the distance between a user and the electronic device;
  calculating the second distance value by processing the electrical signal.

Clause 21.

The method according to any of the clauses 4-13, also including is a capacitive sensor, and the method further comprises the steps of:
  performing a measurement by generating an electrical signal using another sensor, the electrical signal indicative of the distance between a user and the electronic device;
  calculating the first distance value by processing the electrical signal;

Clause 22.

The method according to any of the clauses 14-18, wherein the second sensor is an ultrasound sensor, and the method further comprises the steps of:
  performing the second measurement by: transmitting an ultrasound signal from an ultrasound transmitter, and by generating a measured signal by receiving, at an ultrasound receiver, an echo of the ultrasound signal being reflected by an object;
  calculating the second distance value by processing the measured signal.

Clause 23.

An electronic device configured to perform the steps of any of the clauses 1-22.

Clause 24.

An electronic device comprising a measurement system configured to control an energy level on the electronic device, said energy level being related to the Specific Absorption Rate ("SAR"), wherein the measurement system comprises
  a first sensor configured to generate a first ultrasound signal;
  a processing unit configured to calculate a first distance value from the first signal, the first distance value being indicative of the distance between a user and the electronic device; wherein
  the processing unit is configured to adapt the energy level on the electronic device in response to the first distance value, such that predefined SAR requirements due to exposure of emitted energy from the electronic device are met.

Clause 25.

The electronic device according to clause 24, wherein the first sensor is an ultrasound sensor comprising at least one ultrasound transmitter and at least one ultrasound receiver.

Clause 26.

The electronic device according to clause 25, wherein at least one of the at least one ultrasound transmitter and at least one of the at least one ultrasound receiver are the same component, such as an ultrasound transducer.

Clause 27.

The electronic device according to clause 25, wherein at least one of the at least one ultrasound transmitter and at least one of the at least one ultrasound receiver are separate components, such as a dedicated speaker and a dedicated microphone.

Clause 28.

The electronic device according to clause 24, also including a capacitive sensor, such as a capacitive touchscreen sensor.

Clause 29.

A computer readable program code having specific capabilities for executing the steps of any of the clauses 1-22.

Clause 30.

A non-transitory computer readable medium storing a program causing an electronic device to execute the steps according to any of the clauses 1-22.

The invention claimed is:

1. A method for proximity detection on an electronic device, the method comprising the steps of:
  performing a first measurement using a first ultrasound sensor by:
    transmitting an ultrasound signal from an ultrasound transmitter; and
    generating a measured signal by receiving, at an ultrasound receiver, an echo of the ultrasound signal reflected by an object;
  calculating, using a processing unit, a first distance value from the first measurement; the first distance value being indicative of a distance between a user and the electronic device;
  in response to the first distance value, through the processing unit, adapting an energy level on the electronic device, the energy level being related to the Specific Absorption Rate ("SAR"), such that predefined SAR requirements due to exposure of emitted energy from the electronic device are met calculating, using the processing unit, a first quality factor related to the first measurement;

dependent upon the first quality factor and the distance value, deciding if the processing unit adapts an energy level on the electronic device in relationship to the first distance value; wherein the energy level is related to the Specific Absorption Rate ("SAR"), such that predefined SAR requirements due to exposure of emitted energy from the electronic device are met; and analyzing, using the processing unit, the received ultrasound signal so as to calculate characteristics of a reflecting material based on a shape and attenuation of the received ultrasound signal.

2. The method according to claim 1, comprising adapting the energy level through the processing unit if the first quality factor meets a first criterion.

3. The method according to claim 1, comprising unaffecting the energy level through the processing unit if the first quality factor does not meet a first criterion.

4. The method according to claim 3, comprising:
performing an another first measurement using the first ultrasound sensor;

calculating, using the processing unit, an another first distance value from the another first measurement; the another first distance value being indicative of a distance between the user and the electronic device;

calculating, using the processing unit, an another first quality factor related to the another first measurement; and dependent upon the another first quality factor, deciding if the processing unit adapts the energy level on the electronic device.

5. The method according to claim 4, comprising adapting the energy level through the processing unit if the another first quality factor meets the first criterion.

6. The method according to claim 4, comprising unaffecting the energy level through the processing unit if the another first quality factor does not meet the first criterion.

7. The method according to claim 4, comprising:
processing, using the processing unit, the first measurement in relationship with the another first measurement;

calculating, using the processing unit, an overall quality factor related to the first measurement and the another first measurement; and dependent upon the overall quality factor, deciding if the processing unit adapts the energy level on the electronic device.

8. The method according to claim 7, comprising adapting the energy level through the processing unit if the overall quality factor meets an overall criterion.

9. The method according to claim 7, comprising unaffecting the energy level through the processing unit if the overall quality factor does not meet an overall criterion.

10. The method according to claim 4, comprising:
processing, using the processing unit, the second measurement in relationship with the first measurement and/or the another first measurement;

calculating, using the processing unit, an overall quality factor related to the second measurement and the first measurement and/or the another first measurement; and dependent upon the overall quality factor, deciding if the processing unit adapts the energy level on the electronic device.

11. The method according to claim 3, comprising:
performing a second measurement using a second sensor;

calculating, using the processing unit, a second distance value from the second measurement; the second distance value being indicative of the distance between the user and the electronic device;

calculating, using the processing unit, a second quality factor related to the second measurement; and dependent upon the second quality factor, deciding if the processing unit adapts the energy level.

12. The method according to claim 11, comprising adapting the energy level through the processing unit if the second quality factor meets a second criterion.

13. The method according to claim 11, comprising unaffecting the energy level through the processing unit if the second quality factor does not meet a second criterion.

14. The method according to claim 11, wherein the second sensor is a capacitive sensor, the method comprising:
performing the second measurement by generating an electrical signal using another sensor, the electrical signal indicative of the distance between a user and the electronic device; and calculating the second distance value by processing the electrical signal.

15. The method according to claim 11, wherein the second sensor is an ultrasound sensor, the method comprising:
performing the second measurement by: transmitting an ultrasound signal from an ultrasound transmitter, and by generating a measured signal by receiving, at an ultrasound receiver, an echo of the ultrasound signal being reflected by an object; and calculating the second distance value by processing the measured signal.

16. An electronic device configured to perform the steps of claim 1.

17. A non-transitory computer readable medium storing a program causing an electronic device to execute the steps according to claim 1.

18. A method for proximity detection on an electronic device, the method comprising the steps of:
performing a first measurement using a first ultrasound sensor by:
transmitting an ultrasound signal from an ultrasound transmitter; and
generating a measured signal by receiving, at an ultrasound receiver, an echo of the ultrasound signal reflected by an object;

calculating, using a processing unit, a first distance value from the first measurement; the first distance value being indicative of a distance between a user and the electronic device;

in response to the first distance value, through the processing unit, adapting an energy level on the electronic device, the energy level being related to the Specific Absorption Rate ("SAR"), such that predefined SAR requirements due to exposure of emitted energy from the electronic device are met;

calculating, using the processing unit, a first quality factor related to the first measurement;

dependent upon the first quality factor and the distance value, deciding if the processing unit adapts an energy level on the electronic device in relationship to the first distance value; wherein the energy level is related to the Specific Absorption Rate ("SAR"), such that predefined SAR requirements due to exposure of emitted energy from the electronic device are met; and wherein characteristics are chosen so as to identify softness of a material, so as to be able to distinguish between skin and hard materials.

19. A method for proximity detection on an electronic device, the method comprising the steps of:
performing a first measurement using a first ultrasound sensor by:
transmitting an ultrasound signal from an ultrasound transmitter; and
generating a measured signal by receiving, at an ultrasound receiver, an echo of the ultrasound signal reflected by an object;
calculating, using a processing unit, a first distance value from the first measurement; the first distance value being indicative of a distance between a user and the electronic device;
in response to the first distance value, through the processing unit, adapting an energy level on the electronic device, the energy level being related to the Specific Absorption Rate ("SAR"), such that predefined SAR requirements due to exposure of emitted energy from the electronic device are met;
calculating, using the processing unit, a first quality factor related to the first measurement; and
dependent upon the first quality factor and the distance value, deciding if the processing unit adapts an energy level on the electronic device in relationship to the first distance value;
wherein the energy level is related to the Specific Absorption Rate ("SAR"), such that predefined SAR requirements due to exposure of emitted energy from the electronic device are met;
adapting the energy level through the processing unit if the first quality factor meets a first criterion; and
wherein the first criterion comprises a probability value indicative of that the first distance value is accurate above a predetermined limit.

20. A method for proximity detection on an electronic device, the method comprising the steps of:
performing a first measurement using a first ultrasound sensor by:
transmitting an ultrasound signal from an ultrasound transmitter; and
generating a measured signal by receiving, at an ultrasound receiver, an echo of the ultrasound signal reflected by an object;
calculating, using a processing unit, a first distance value from the first measurement; the first distance value being indicative of a distance between a user and the electronic device;
in response to the first distance value, through the processing unit, adapting an energy level on the electronic device, the energy level being related to the Specific Absorption Rate ("SAR"), such that predefined SAR requirements due to exposure of emitted energy from the electronic device are met;
calculating, using the processing unit, a first quality factor related to the first measurement;
dependent upon the first quality factor and the distance value, deciding if the processing unit adapts an energy level on the electronic device in relationship to the first distance value;
wherein the energy level is related to the Specific Absorption Rate ("SAR"), such that predefined SAR requirements due to exposure of emitted energy from the electronic device are met;
unaffecting the energy level through the processing unit if the first quality factor does not meet a first criterion;
performing a second measurement using a second sensor;
calculating, using the processing unit, a second distance value from the second measurement; the second distance value being indicative of the distance between the user and the electronic device;
calculating, using the processing unit, a second quality factor related to the second measurement; and
dependent upon the second quality factor, deciding if the processing unit adapts the energy level;
adapting the energy level through the processing unit if the second quality factor meets a second criterion; and
wherein at least one of the overall criterion, and the second criterion comprise an individual probability value indicative of that the respective the another first distance value and/or the second distance value is/are accurate above their respective predetermined limit.

* * * * *